(12) United States Patent
Ogasawara

(10) Patent No.: US 7,122,809 B2
(45) Date of Patent: Oct. 17, 2006

(54) CHARGED BEAM WRITING METHOD AND WRITING TOOL

(75) Inventor: Munehiro Ogasawara, Hiratsuka (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 4 days.

(21) Appl. No.: 11/001,316

(22) Filed: Dec. 2, 2004

(65) Prior Publication Data

US 2005/0133739 A1 Jun. 23, 2005

(30) Foreign Application Priority Data

Dec. 5, 2003 (JP) ............... 2003-407369

(51) Int. Cl.
*G21K 5/10* (2006.01)
*H01J 37/08* (2006.01)

(52) U.S. Cl. ............... 250/492.22; 250/492.1; 250/397

(58) Field of Classification Search ............ 250/492.22
See application file for complete search history.

(56) References Cited

U.S. PATENT DOCUMENTS

| 4,937,458 | A | * | 6/1990 | Fujikura | ............... | 250/492.2 |
| 5,304,811 | A | * | 4/1994 | Yamada et al. | ........ | 250/492.22 |
| 6,027,843 | A | * | 2/2000 | Kojima et al. | ............... | 430/30 |
| 6,555,830 | B1 | * | 4/2003 | Mankos et al. | .......... | 250/492.2 |

FOREIGN PATENT DOCUMENTS

| JP | 06-188180 | 7/1994 |
| JP | 2000-349021 | 12/2000 |
| JP | 2002-373856 | 12/2002 |

OTHER PUBLICATIONS

Nakayama, Y. et al., "Thermal Characteristics of Si Mask for EB Cell Projection Lithography", Jpn. J. Appl. Phys., vol. 31, Part 1, No. 12B, pp. 4268-4272, (Dec. 1992).

* cited by examiner

*Primary Examiner*—David A. Vanore
(74) *Attorney, Agent, or Firm*—Finnegan, Henderson, Farabow, Garrett & Dunner, L.L.P.

(57) ABSTRACT

A charged beam writing method includes acquiring reference data of shapes or positions of a plurality of apertures of a second shaping aperture, thereafter performing a writing operation, scanning a beam passed through a first shaping aperture over the second shaping aperture while a blanking deflector is driven to intercept irradiation of the shaped beam to the surface of a substrate to be processed by the blanking aperture after performing the writing operation for a certain time, measuring the shapes or the positions of apertures of the second shaping aperture by a detector, comparing the shapes or the positions with the reference data to thereby measure shift amounts of the shapes or the positions of apertures of the second shaping aperture, correcting a deflection amount of the objective deflector in accordance with the shift amount, and resuming the writing operation after stopping the driving of the blanking deflector.

21 Claims, 9 Drawing Sheets

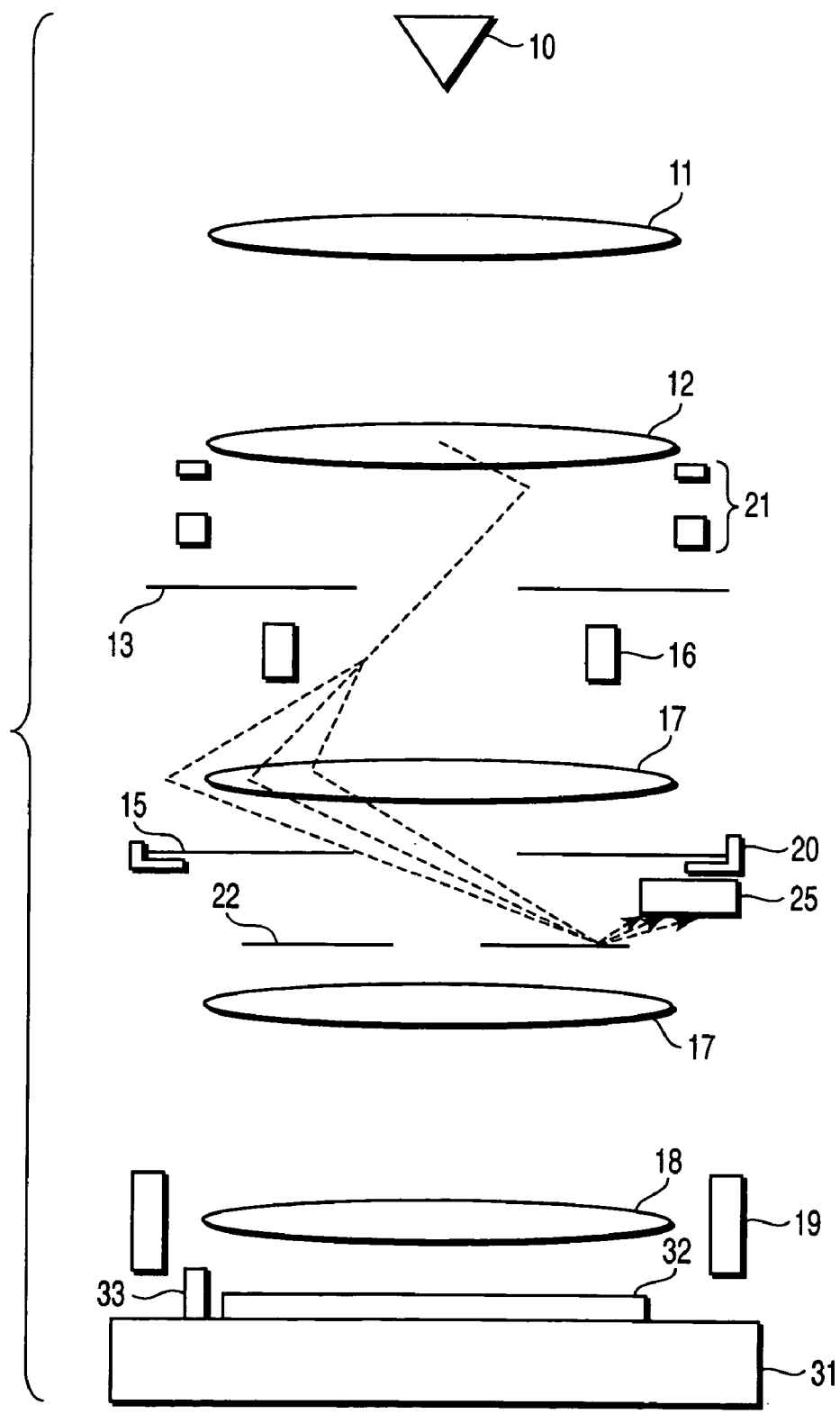
F I G. 4

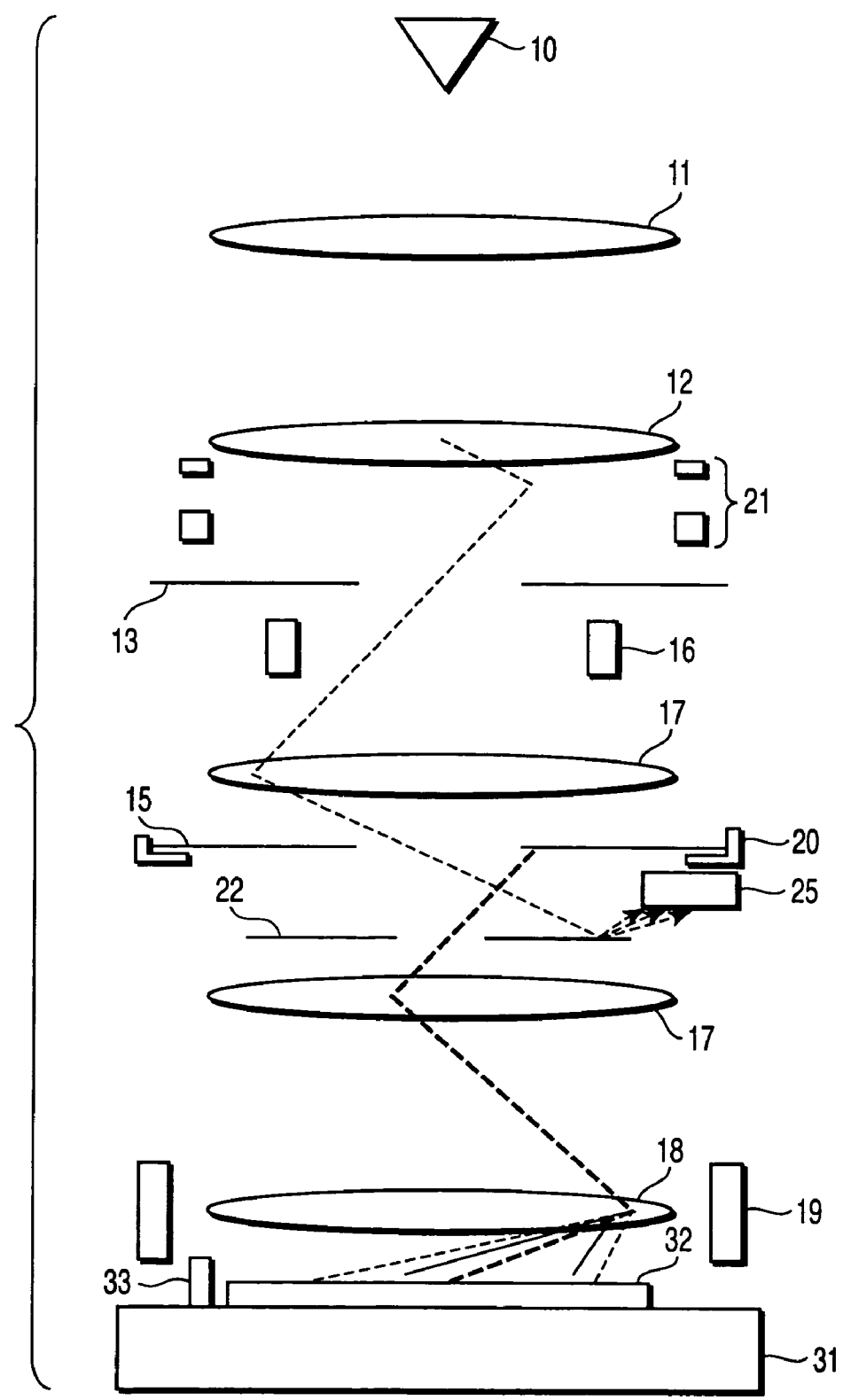
F I G. 9

CHARGED BEAM WRITING METHOD AND WRITING TOOL

CROSS-REFERENCE TO RELATED APPLICATIONS

This application is based upon and claims the benefit of priority from prior Japanese Patent Application No. 2003-407369, filed Dec. 5, 2003, the entire contents of which are incorporated herein by reference.

BACKGROUND OF THE INVENTION

1. Field of the Invention

The present invention relates to a charged beam writing technique to write an LSI pattern using a charged beam, particularly to a charged beam writing method and a writing tool configured to correct a beam positional shift on the surface of a substrate to be processed accompanying thermal deformation of a shaping aperture.

2. Description of the Related Art

In recent years, in an electron beam writing tool, a so-called character projection system has been adopted which exposes a character pattern beam formed by a character aperture beforehand to form repeated patterns on a wafer. In this system, a rectangular aperture (opening) is disposed in a first shaping aperture, various pattern apertures (character patterns) are disposed in a second shaping aperture, an image of the first shaping aperture is moved by a beam shaping deflector on the second shaping aperture, and accordingly a desired pattern can be selected. Here, it is assumed that a beam shaped by the character pattern is also categorized in shaped beam.

Additionally, most of the energy of the electron beam which does not pass through the aperture is absorbed by the second shaping aperture in a state in which the electron beam is applied onto the second shaping aperture. For example, silicon is used in a material of the aperture, and the coefficient of thermal expansion is about $2.4 \times 10^{-6}$/K. Even when the material symmetrically expands, but when temperature rises by 40K, the opening positioned apart from a center of the aperture by 1 mm moves by about 100 nm. When a reduction ratio of electron optics is 1/15, a positional shift is about 7 nm on the substrate to be processed, and the positional shift cannot be ignored. In heat inflow during the writing, both position and quantity of heat change with time, and it is therefore difficult to predict movement of an aperture position by the thermal expansion.

In contrast, there has been proposed a method of scanning the electron beam on a mark disposed on a stage for mounting a substrate to thereby measure and correct the positional shift of the beam on the substrate to be processed (refer to, for example, Jpn. Pat. Appln. KOKAI Publication No. 2002-373856). However, in order to apply the electron beam to the mark on the stage, the stage needs to be moved to thereby retreat the substrate to be processed in such a manner as to prevent the electron beam from being applied to the substrate to be processed. Since the stage movement is much slower than deflection of the electron beam, correction of the positional shift requires a long time. Moreover, when the positional shift is corrected many times during the writing, the above-described mark measuring results in a drop of the serviceability ratio of the tool.

Thus, the beam positional shift on the surface of the substrate to be processed accompanying the thermal deformation of the second shaping aperture has not heretofore been ignorable. When the positional shift is measured using the mark on the stage, the stage needs to be moved greatly, and there has been a problem that much time is required in measurement and the tool serviceability ratio drops.

Therefore, there has been a demand for realization of a charged beam writing method and a writing tool capable of measuring and correcting the shift of the beam applied position on the surface of the substrate to be processed accompanying the thermal deformation of the shaping aperture and capable of contributing to enhancement of the tool serviceability ratio.

BRIEF SUMMARY OF THE INVENTION

According to a first aspect of the invention, there is provided a charged beam writing method which comprises:

preparing a charged beam writing tool comprising: a first shaping aperture and a second shaping aperture disposed apart from each other in a beam axis direction in order to shape a charged beam, the second shaping aperture having a plurality of apertures; a shaping deflector disposed between the first shaping aperture and the second shaping aperture; an objective deflector which irradiates a shaped beam formed by the first shaping aperture and the second shaping aperture and the shaping deflector on a desired position on a surface of a substrate to be processed; a blanking deflector disposed on an upstream side of the first shaping aperture; a blanking aperture disposed on a downstream side of the second shaping aperture to intercept the shaped beam based on driving of the blanking deflector; and a detector which detects shapes or positions of the plurality of apertures of the second shaping aperture;

acquiring reference data of the shapes or the positions of the plurality of apertures of the second shaping aperture;

performing a writing operation after acquiring the reference data;

measuring shift amounts of the shapes or the positions of the plurality of apertures of the second shaping aperture by scanning a beam passed through the first shaping aperture over the second shaping aperture in a state in which the blanking deflector is driven to prevent the shaped beam from irradiating the surface of the substrate to be processed by the blanking aperture after performing the writing operation for a certain time, measuring the shapes or the positions of the plurality of apertures of the second shaping aperture by the detector, and comparing the shapes or the positions with the reference data;

correcting a deflection amount of the objective deflector or the shaping deflector in accordance with the shift amount; and resuming the writing operation after interrupting the driving of the blanking deflector.

According to a second aspect of the invention, there is provided a charged beam writing tool which comprises:

a charged beam source which produces a charged beam;

a first shaping aperture which shapes the charged beam to produce a first shaped beam;

a second shaping aperture having a plurality of apertures on which the first shaped beam is projected and which selectively passes the first shaped beam through the plurality of apertures to form a second shaped beam;

a shaping deflector which is disposed between the first shaping aperture and the second shaping aperture and which varies a projected position of the first shaped beam over the second shaping aperture;

an objective deflector which deflects the second shaped beam;

a stage on which a substrate to be processed is mounted to be irradiated with the second shaped beam;

a blanking deflector disposed between the charged beam source and the first shaping aperture;

a blanking aperture disposed between the second shaping aperture and the objective deflector and which intercept the second shaped beam based on driving of the blanking deflector;

a memory which stores reference shapes or reference positions of the plurality of apertures as first data;

a first detector which, when the first shaped beam is scanned over the second shaping aperture in a state in which the blanking deflector is driven to intercept irradiation of the second shaped beam onto the substrate to be processed, measures shapes or positions of the plurality of apertures in the second shaping aperture to acquire second data;

a control calculator which compares the second data with the first data to calculate a shift amount; and a first deflection control circuit which corrects a deflection amount of the objective deflector in accordance with the shift amount.

BRIEF DESCRIPTION OF THE SEVERAL VIEWS OF THE DRAWING

FIG. 4 is a schematic diagram showing a method of measuring the beam positional shift in the first embodiment;

FIG. 9 is a schematic diagram showing a method of measuring the beam positional shift in a second embodiment;

DETAILED DESCRIPTION OF THE INVENTION

According to embodiments described hereinafter, since a positional shift of an aperture of a second shaping aperture can be measured in a blanking state of a charged beam, a stage for mounting a substrate does not have to be moved, and the shift can be measured in a short time. In other words, a time required in measuring a necessary correction amount for irradiating a pattern on a substrate to be processed with good precision can be minimized. Therefore, a time for correcting the beam positional shift shortens, and a tool serviceability ratio can be enhanced. The embodiments of the present invention will be described hereinafter with reference to the drawings.

First Embodiment

Figure 1:
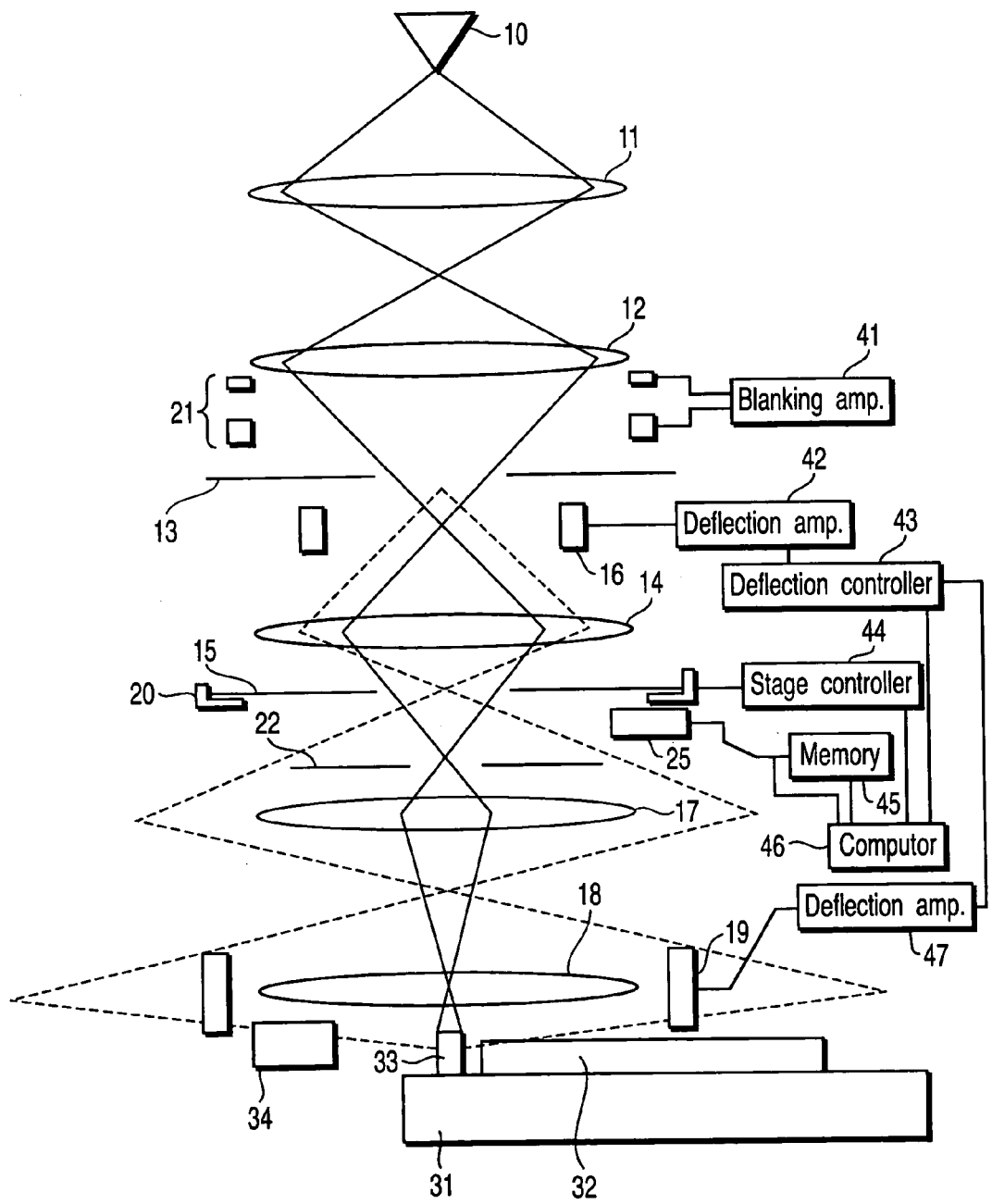
FIG. 1 is a schematic configuration diagram showing an electron beam writing tool according to a first embodiment.

FIG. 1 is a schematic configuration diagram showing an electron beam writing tool according to a first embodiment of the present invention. An electron beam emitted from an electron gun 10 which is an electron source, for example, at an acceleration voltage of 50 kV is focused by condenser lenses 11, 12, and applied onto a first shaping aperture 13. The first shaping aperture 13 is formed of silicon, and a rectangular aperture (opening) is disposed in this aperture 13. A first shaping beam passed through the aperture 13 has a rectangular sectional shape. The first shaping beam is focused by a projection lens 14, and formed into an image on a second shaping aperture 15 formed of silicon.

A beam shaping deflector 16 is disposed between the first shaping aperture 13 and the second shaping aperture 15, and an irradiation position of the first shaping beam on the second shaping aperture 15 can be changed by the beam shaping deflector 16. It is to be noted that the condenser lenses 11, 12 are excited in such a manner that a crossover image matches a center of deflection of the beam shaping deflector 16.

Figure 2:
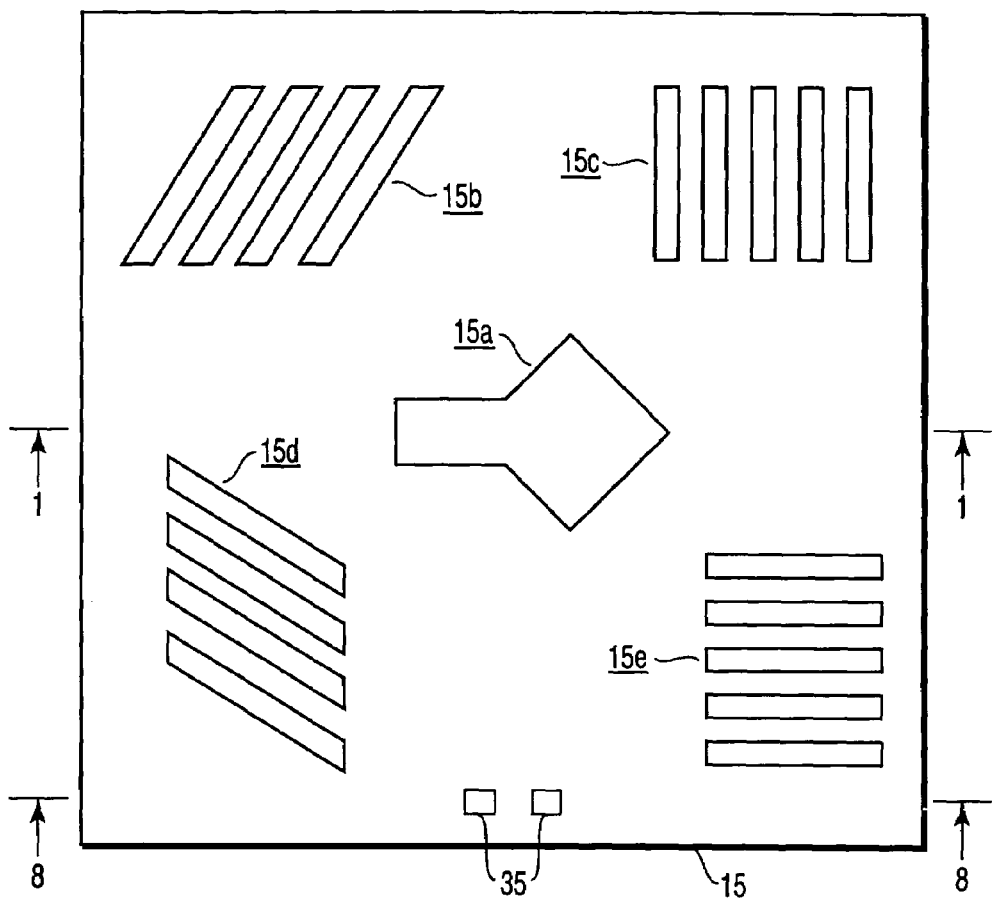
FIG. 2 is a plan view showing one example of a second shaping aperture for use in the electron beam writing tool of FIG. 1.

As shown in FIG. 2, various apertures (openings) are disposed in the second shaping aperture 15, the first shaping beam is transmitted through a desired portion of the second shaping aperture 15, and accordingly the electron beam having a desired sectional shape can be obtained. Reference numeral 15a denotes a variable shaping aperture, and 15b to 15e denote character apertures. The second shaping aperture 15 is formed with a thickness of about 20 μm.

It is to be noted that, although the aperture 15a and the apertures 15b–15e are depicted as close, they are actually disposed apart from each other such that the beam for the aperture 15a does not irradiate the aperture 15b–15e.

A second shaping beam transmitted through the second shaping aperture 15 is focused by a demagnification lens 17 and an objective lens 18, and formed into an image on the surface of a substrate 32 to be processed such as a wafer laid on a stage 31. The demagnification lens 17 is excited in such a manner that a crossover image of the second shaping beam is formed in a principal plane position of the objective lens 18. An objective deflector 19 is disposed in the principal plane position of the objective lens 18, and the position of the second shaping beam on the surface of the substrate to be processed can be varied by the objective deflector 19.

A blanking deflector 21 is disposed between the condenser lens 12 and the first shaping aperture 13, and a blanking aperture 22 in whose middle an aperture (opening) is disposed is disposed in a position where the crossover image is formed by the projection lens 14 between the second shaping aperture 15 and the demagnification lens 17. The blanking deflector 21 is driven by a blanking amplifier 41, the crossover image position on the blanking aperture 22 is moved from the aperture, and accordingly the electron beam is interrupted. It is to be noted that the blanking deflector 21 has two stages, and a beam center position on the first shaping aperture 13 does not fluctuate even at a blanking time.

An electron detector 25 for detecting a reflected electron from the blanking aperture 22 is disposed on the upstream side of the blanking aperture 22. As the electron detector 25, detectors having high response speeds can be used such as a semiconductor sensor and a micro-channel plate. Data detected by the electron detector 25 is stored in a memory 45 if necessary.

Moreover, the second shaping aperture 15 is mounted on a shaping aperture stage 20 capable of measuring the position by a laser interferometer or the like (not shown), and is movable in a direction crossing an optical axis direction at right angles. The aperture stage 20 is controlled by a stage controller 44.

Furthermore, a mark 33 for measuring a beam dimension, shape and position is disposed in a peripheral portion of the stage 31. Additionally, a reflected electron detector 34 for detecting the reflected electrons from the mark 33 is disposed between the stage 31 and the objective lens 18.

It is to be noted that the beam shaping deflector 16 and the objective deflector 19 are controlled by deflection amplifiers 42, 47. The deflection amplifiers 42, 47 and the blanking amplifier 41 are controlled by a deflection controller 43. Furthermore, the deflection controller 43, the stage controller 44, and a computer 46 for controlling the memory 45 and the like are disposed.

Next, an outline of the method of correcting the beam positional shift by the present tool will be described with reference to FIG. 3. First, as adjustment before the writing, initial data and the like concerning the shape, position data, deflection condition and the like of the second shaping aperture is acquired (S1). This initial data is reference data of correction.

Next, an actual writing operation starts (S2). When the writing finishes in a short time, the operation ends. When the operation continues, elapsed time is monitored (S3). When a predetermined time has elapsed, the shapes and the position data of the character aperture and/or the variable shaping aperture of the second shaping aperture are acquired, and compared with initial data obtained in step 1, and the deflection conditions of the beam shaping deflector and the objective deflector are corrected in a direction in which the shift is corrected (S5). After the correction, the operation returns to the writing operation, and step 2 and subsequent steps are repeated.

Figure 5:
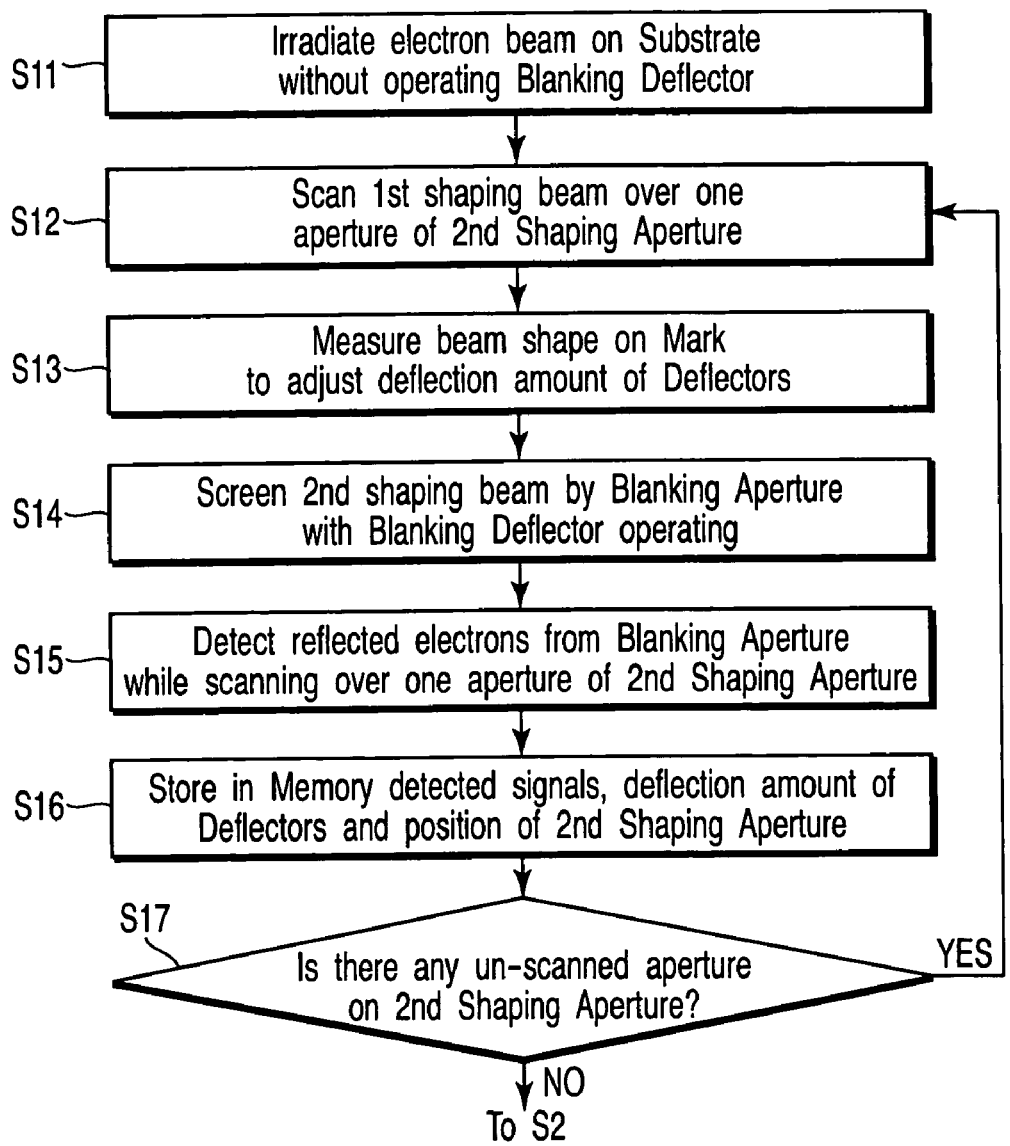
FIG. 5 is a flowchart showing step 1 of FIG. 3 in detail.

Details of each step will be described hereinafter with reference to FIGS. 4 to 7. FIG. 4 is a diagram schematically showing a method of measuring the beam positional shift, and peripherals such as a computer are omitted. FIG. 5 is a detailed flowchart of the step 1 (S1) of FIG. 3.

First in the adjustments before the writing in S1, the blanking deflector 21 is brought into an inoperative state, and the electron beam is irradiated on the surface of the substrate to be processed (S11). At this time, as shown in FIG. 1, the stage 31 is moved beforehand in such a manner that the mark 33 for measuring the beam is disposed in the beam irradiation position or in its vicinity.

Next, the first shaping beam is scanned over one aperture of the second shaping aperture 15 using the beam shaping deflector 16 (S12). In this state, the second shaping beam is scanned over the mark 33 on the stage 31, the reflected electrons at this time are detected by the electron detector 34, and the beam shape is measured. Moreover, the deflection amount of the beam shaping deflector 16 and the correction deflection amount of the objective deflector 19 are adjusted in such a manner as to obtain a desired pattern in a desired position (S13).

Next, the blanking deflector 21 is operated to screen the second shaping beam by the blanking aperture 22 (S14). In this state, the second shaping beam is scanned over the second shaping aperture 15 using the beam shaping deflector 16, and the reflected electrons from the blanking aperture 22 are measured by the electron detector 25 (S15). A sensed signal profile obtained at this time corresponds to the selected aperture of the second shaping aperture 15, and includes the positional shift amount of this aperture.

Then, the sensed signal profile obtained by the electron detector 25, the obtained deflection amounts of the deflectors 16, 19, and the position of the shaping aperture stage are stored in the memory 45 and the like (S16). That is, a relation among the sensed signal profile, the deflection amount, and the position of the shaping aperture stage without any beam positional shift by thermal expansion during the operation is recorded in a table.

When there is any unscanned aperture in the second shaping aperture, the flow returns to step 12, the beam shape is similarly measured, and all the apertures are measured in this manner (S17). The above-described operation is performed with respect to the second shaping aperture 15 at different temperatures, and results are recorded in a table. Accordingly, it is possible to more precisely correct the beam positional shift described later.

Figure 3:
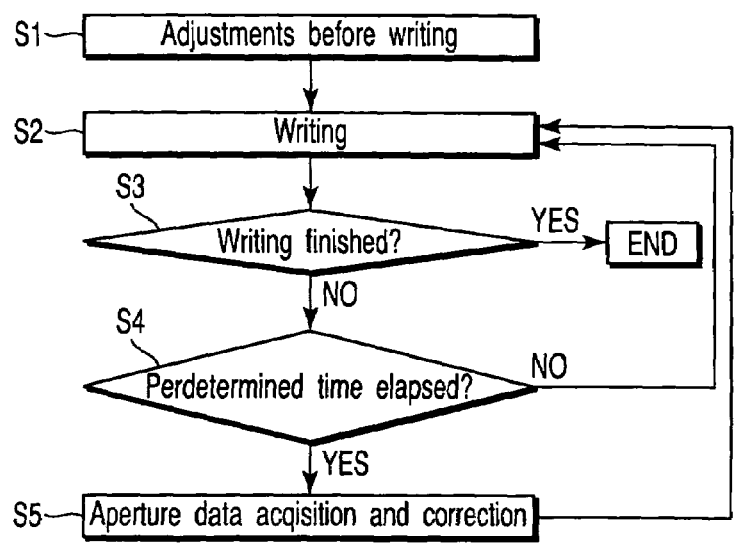
FIG. 3 is a flowchart showing outline of a writing method of the first embodiment.

Next, the flow returns to step 2 (S2) of FIG. 3 to start the writing onto the substrate 32 to be processed. The surface of the substrate 32 to be processed is coated with a resist. A predetermined voltage is generated in the deflection amplifier 42 by the deflection controller 43 based on writing data, the beam shaping deflector 16 is driven, and accordingly an electron beam having a desired pattern shape as a sectional shape is produced and applied to desired positions on the substrate 32 to be inspected by the objective deflector 19.

The apertures (referred to as the character apertures) 15b to 15e for producing a pattern are disposed beforehand on the second shaping aperture 15 with respect to repeatedly used patterns among the patterns written on the substrate 32 to be processed. The electron beam is transmitted through these apertures by the beam shaping deflector 16, accordingly an electron beam having the pattern shape is produced, and the pattern can be formed at once. As to a pattern for which any appropriate character aperture is not prepared in the second shaping aperture 15, a rectangular or right-angled triangular beam having arbitrary dimensions is produced to write the pattern using the variable shaping aperture 15a disposed in the middle portion of the second shaping aperture 15.

When the writing operation is finished in a short time, the writing operation is finished (S3). When the writing operation continues, and when the temperature of the second shaping aperture 15 rises as described in the paragraphs of the related art, the beam position on the surface of the substrate to be processed moves with thermal expansion of the aperture 15. Then, in the present embodiment, when the elapsed time of the operation is monitored, and the predetermined time has elapsed (S4), the beam positional shift or the beam shape is corrected (S5).

Figure 6:
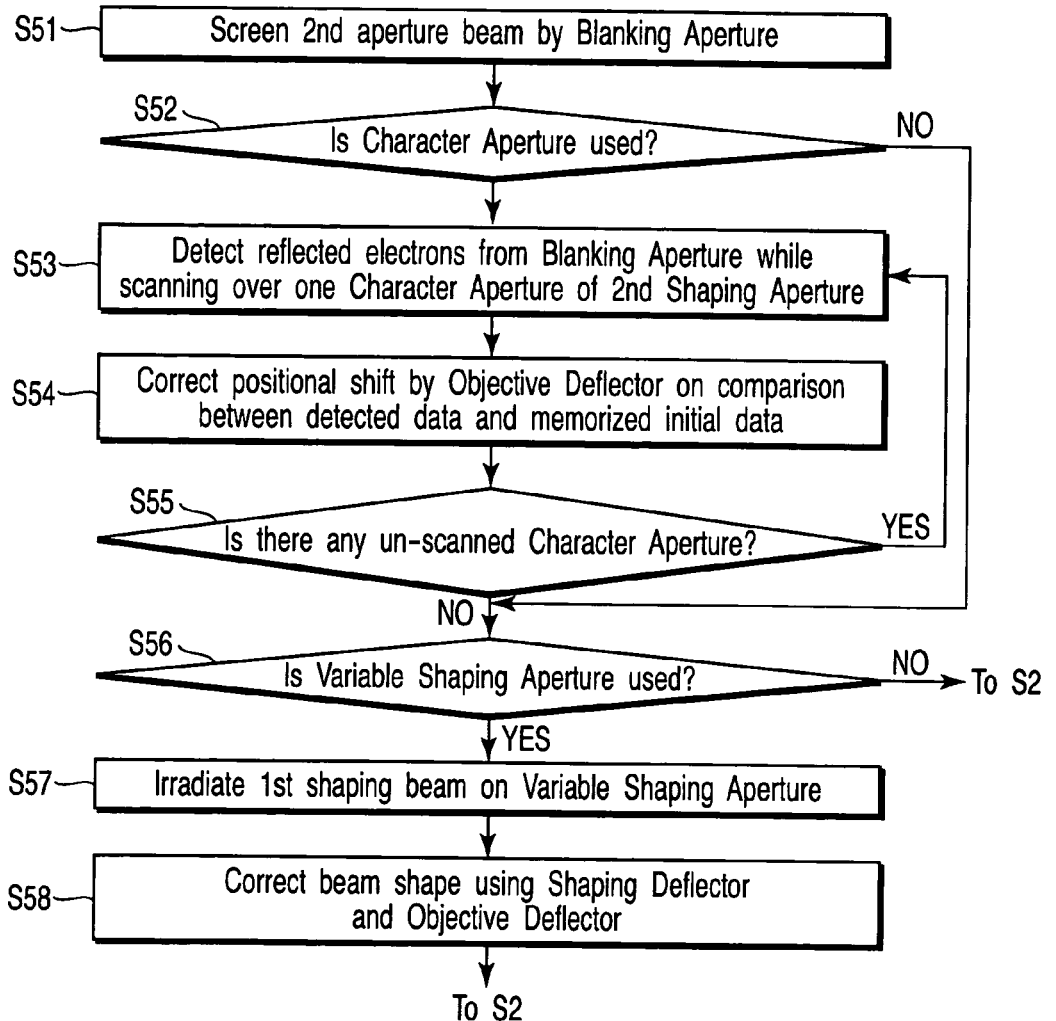
FIG. 6 is a flowchart showing step 5 of FIG. 3 in detail.

FIG. 6 is a flowchart showing step 5 (S5) of FIG. 3 in more detail. First, a voltage is applied to the blanking deflector 21 to screen the second shaping beam by the blanking aperture 22 (S51), and it is checked whether or not the character aperture is used (S52). When the character aperture is used, the deflection voltage is applied to the beam shaping deflector 16 to irradiate the first shaping beam on one character aperture in this state (S53). Furthermore, as shown in FIG. 4, while the driving voltage of the beam shaping deflector 16 is changed, the first shaping beam is scanned over the character aperture. A reflected electron signal profile obtained by the electron detector 25 at this time, and the position of the second shaping aperture 15 at this time are compared with the reflected electron signal profile stored beforehand in a memory and the second shaping aperture position to thereby measure a positional shift amount. The correction deflection amount in the objective deflector 19 is adjusted in accordance with the obtained positional shift amount, so that the second shaping beam is irradiated on a desired position on the substrate 32 to be processed (S54). As to other character apertures, a similar process is performed (S55).

When the same character aperture is irradiated with the electron beam for a long time, measuring is performed, for example, every other minute. Even in this case, the stage is not moved, the above-described measurement can be performed in a short time, and the writing time only increases slightly.

Thus, the positional shift of the character aperture of the second shaping aperture 15 by the thermal expansion results in the positional shift on the surface of the substrate 32 to be processed, and can be corrected by the objective deflector 19 as described above. In contrast, since the first shaping beam is larger than the character aperture, some positional shift of the character aperture can be absorbed. However, when the positional shift of the character aperture is large, the aperture protrudes from an irradiation area of the first shaping beam, and therefore the deflection amount of the beam shaping deflector 16 is corrected by an amount corresponding to the positional shift of the character aperture.

Next, it is judged whether or not the variable shaping aperture is used (S56). When the variable shaping aperture is used, the positional shift of the aperture results in a change of the beam shape together with the positional shift of the surface of the substrate 32 to be processed. The first shaping beam is irradiated on the variable shaping aperture (S57). When the beam shape changes, the deflection voltages of the objective deflector 19 and the beam shaping deflector 16 are corrected, and accordingly the change of the beam shape can be eliminated (S58). Thereafter, the process returns to step 2 (S2) of FIG. 3, and the writing operation continues.

Figure 7:
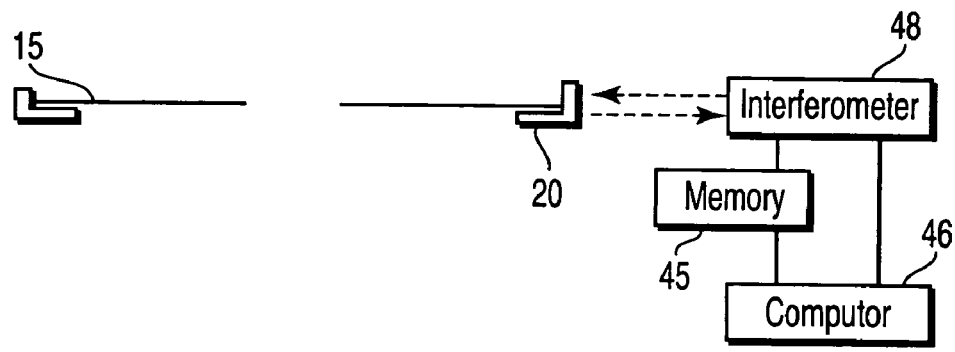
FIG. 7 is a schematic diagram showing one example of the method of measuring the position of the second shaping aperture.
Figure 8:
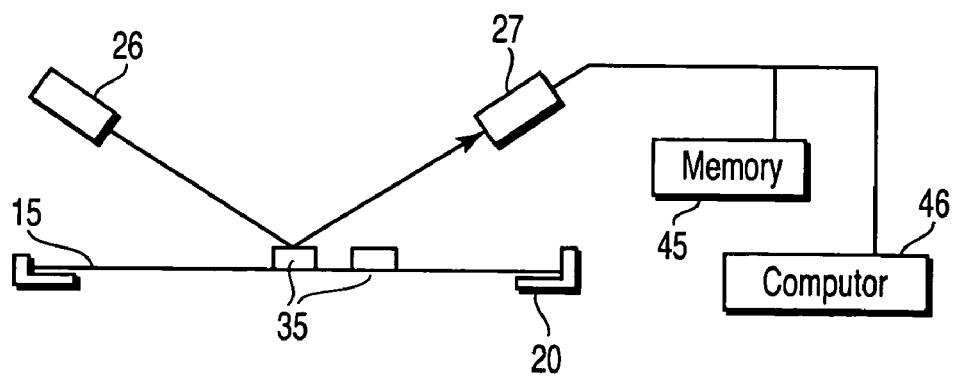
FIG. 8 is a schematic diagram showing another example of the method of measuring the position of the second shaping aperture.

Here, several examples of the method of measuring the position of the second shaping aperture will be described. FIG. 7 shows a first example. A laser interferometer is disposed on the side surface of the stage 20 for the second shaping aperture to measure a horizontal position of the second shaping aperture. FIG. 8 shows a second example. A plurality of mark patterns 35 are disposed in a peripheral portion of the second shaping aperture (see FIG. 2), and the position is optically detected using a light source 26 and a photosensor 27. When two or more mark patterns are disposed, a plurality of places are measured, accordingly rotation of the aperture can be measured, and measurement precision can be raised. In the first example, positioning precisions of the second shaping aperture 15 and the stage 20 are required. Since the position is directly obtained on the second shaping aperture in the second example, the higher precision can be obtained.

In this manner, according to the present embodiment, the blanking deflector 21 is driven to screen the second shaping beam from the surface of the substrate 32 to be processed, the first shaping beam is scanned over the desired aperture (opening) on the second shaping aperture 15 in this state, the obtained reflected electrons from the blanking aperture 22 are detected, and accordingly the shift amount of the aperture position can be measured. Furthermore, when the deflection voltage of the objective deflector 19 is corrected in accordance with the shift amount, the shift of the beam position on the surface of the substrate 32 to be processed can be suppressed, and accordingly the writing precision can be raised.

Moreover, in this case, the mark 33 on the stage 31 is not detected, and the only reflected electrons from the blanking aperture 22 is detected by the scanning of the first shaping beam in a state in which the beam is blanked (intercepted).

Therefore, the stage 31 does not have to be moved, and the shift of the aperture position can be measured in a considerably short time. Therefore, the shift of the beam irradiation position on the substrate surface accompanying the thermal deformation of the second shaping aperture 15 can be measured in a short time, and this can contribute to enhancement of the tool serviceability ratio.

Second Embodiment

Even when the beam position shift is corrected in a blanking state as in the first embodiment, there is a possibility that some leakage electrons or scattered electrons reach the surface of the substrate 32 to be processed through the apertures of the blanking aperture 22. The leakage electrons or the scattered electrons are irradiated around portions where the electrons are to be irradiated when the blanking deflector 21 does not operate. This amount is slight, but the measuring time is much longer as compared with the time for which a resist is sensitized to light at a writing time. Therefore, when the surface of the substrate 32 to be processed is coated with a high-sensitivity resist, there is a possibility that the resist is sensitized to the electron beam to some degree.

To avoid this phenomenon in the present embodiment, when the aperture positional shift of the second shaping aperture 15 is measured in a blanking state as shown in FIG. 9, the objective deflector 19 is operated, and the irradiation positions of the leakage electrons or the scattered electrons on the surface of the substrate 32 to be processed fluctuate. In this case, when the irradiation amount onto the resist is spatially scattered, the above-described problem of the sensitization of the resist to light can be largely solved.

Therefore, according to the present embodiment, needless to say, effects similar to those of the first embodiment are obtained, the resist can be more securely prevented from being sensitized to the electron beam during the beam positional shift correction, and more reliable writing is possible. It is to be noted that in FIG. 9, to simplify the drawing, an attached control circuit of a computer or the like is omitted.

(Modification)

Figure 10:
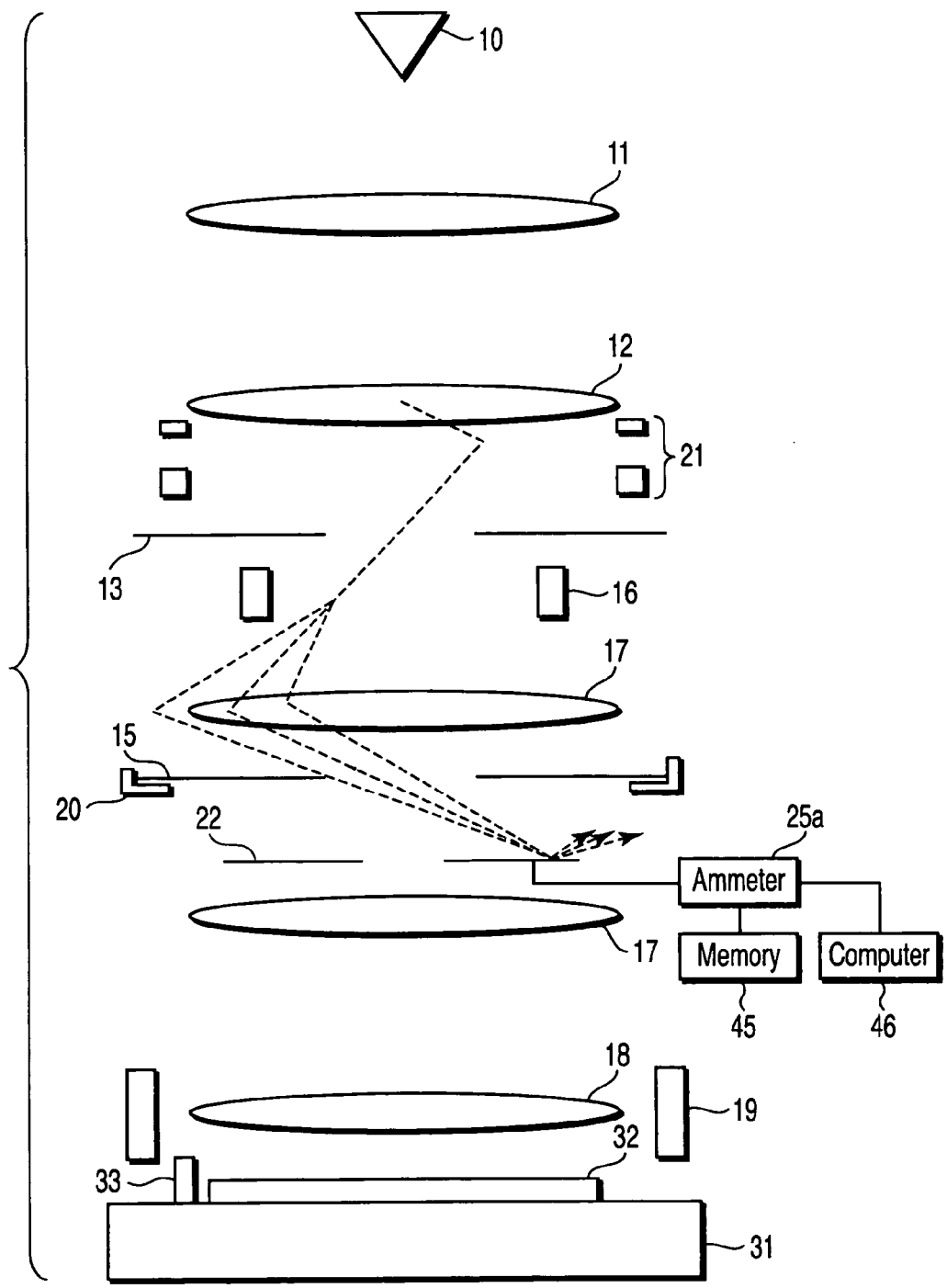
FIG. 10 is a schematic diagram showing a method of measuring the positional shift of the second shaping aperture according to a first modification.

It is to be noted that the present invention is not limited to the above-described embodiments. In the embodiment, the reflected electrons from the blanking aperture 22 are detected in order to obtain the positional shift amount of the aperture in the shaping aperture, but an inflow current into the blanking aperture may be detected instead. Concretely, as shown in FIG. 10, an ammeter 25a is connected to the blanking aperture 22, and an obtained current value may be stored in the memory 45, or supplied to the computer 46.

Figure 11:
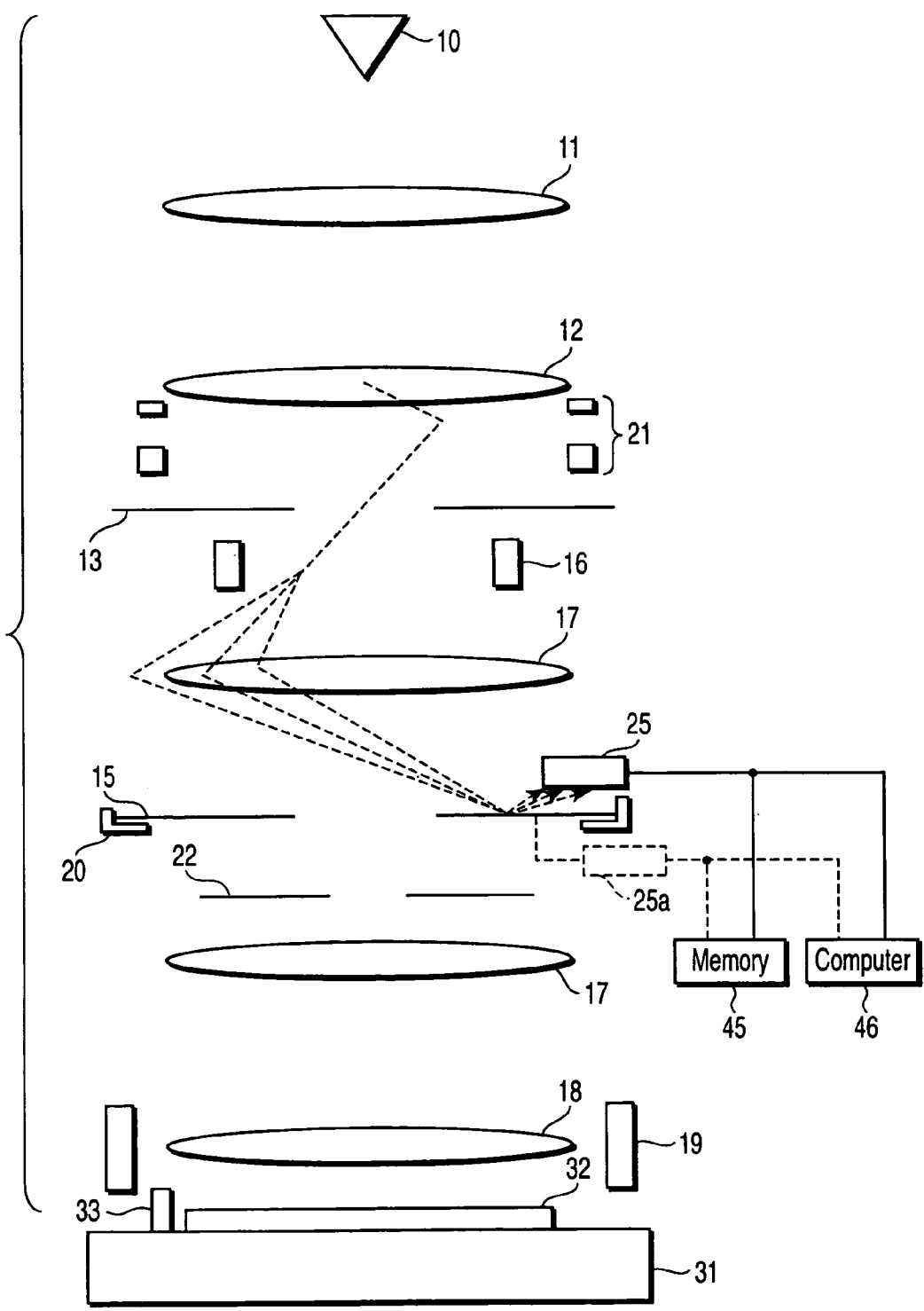
FIG. 11 is a schematic diagram showing the method of measuring the positional shift of the second shaping aperture according to a second modification.

Furthermore, as shown FIG. 11, reflected electrons from the second shaping aperture 15 are detected by the electron detector 25, or an inflow current into the second shaping aperture 15 may be detected by the ammeter 25a.

Moreover, a basic configuration of the writing tool is not limited to FIG. 1, and can be appropriately changed in accordance with specifications. In the embodiment, two stages of shaping apertures are disposed and, needless to say, more stages of shaping apertures can be used. Furthermore, the blanking deflector may be disposed on an upstream side of the first shaping aperture, the blanking aperture may be disposed on a downstream side of the second shaping aperture, and these positions are not limited to those of FIG. 1 and can be appropriately changed.

Moreover, as the desired apertures (openings) on the second shaping aperture 15 which are objects of shaping beam scanning for detecting the reflected electrons from the blanking aperture 22, the apertures (openings) for obtaining an electron beam having desired sectional shapes are also used in measuring the positional shift correction in the above-described embodiment. However a mark exclusive for measuring the correction may be disposed on the second shaping aperture 15, and used in the measuring instead. In this way, managing of coordinates measurement is facilitated.

Furthermore, the present invention is not limited to an electron beam writing tool, and is also applicable to an ion beam writing tool. The ion beam writing tool has the same substantial configuration except that the electron source is an ion source.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A charged beam writing method comprising: preparing a charged beam writing tool comprising:
    a first shaping aperture and a second shaping aperture disposed apart from each other in a beam axis direction in order to shape a charged beam, the second shaping aperture having a plurality of apertures formed thereon;
    a shaping deflector disposed between the first shaping aperture and the second shaping aperture;
    an objective deflector which irradiates a shaped beam formed by the first shaping aperture and the second shaping aperture and the shaping deflector on a desired position on a surface of a substrate to be processed;
    a blanking deflector disposed on an upstream side of the first shaping aperture;
    a blanking aperture disposed on a downstream side of the second shaping aperture to intercept the shaped beam based on driving of the blanking deflector; and
    a detector which detects shapes or positions of the plurality of apertures of the second shaping aperture;
  acquiring reference data of the shapes or the positions of the plurality of apertures of the second shaping aperture;
  performing a writing operation after acquiring the reference data;
  measuring shift amounts of the shapes or the positions of the plurality of apertures of the second shaping aperture by scanning a beam passed through the first shaping aperture over the second shaping aperture in a state in which the blanking deflector is driven to prevent the shaped beam from irradiating the surface of the substrate to be processed by the blanking aperture after performing the writing operation for a certain time, measuring with the detector the shapes or the positions of the plurality of apertures of the second shaping aperture irradiated on a surface of the blanking aperture, and comparing the shapes or the positions with the reference data;
  correcting a deflection amount of the objective deflector or the shaping deflector in accordance with the shift amount; and
  resuming the writing operation after interrupting the driving of the blanking deflector.

2. The charged beam writing method according to claim 1, further comprising measuring a beam shape of the shaped beam before performing the writing operation.

3. The charged beam writing method according to claim 1, wherein said measuring the shift amounts of the shapes or the positions of the plurality of apertures of the second shaping aperture further comprises detecting reflected electrons from the blanking aperture.

4. The charged beam writing method according to claim 1, wherein said measuring the shift amounts of the shapes or the positions of the plurality of apertures of the second shaping aperture further comprises detecting reflected electrons from the second shaping aperture.

5. The charged beam writing method according to claim 1, wherein said measuring the shift amounts of the shapes or the positions of the plurality of apertures of the second shaping aperture further comprises detecting an inflow current into the blanking aperture.

6. The charged beam writing method according to claim 1, wherein said measuring the shift amounts of the shapes or the positions of the plurality of apertures of the second shaping aperture further comprises detecting an inflow current into the second shaping aperture.

7. The charged beam writing method according to claim 1, further comprising correcting a deflection amount of the shaping deflector in a case where the shaped beam involves a change of a beam shape.

8. The charged beam writing method according to claim 1, further comprising driving the objective deflector in such a manner as to move a position of an image of the second shaping aperture on a surface of the substrate to be processed while measuring the shift amounts of the shapes or the positions of the plurality of apertures of the second shaping aperture.

9. A charged beam writing tool comprising:
    a charged beam source which produces a charged beam;
    a first shaping aperture which shapes the charged beam to produce a first shaped beam;
    a second shaping aperture having a plurality of apertures formed thereon onto which the first shaped beam is projected and which selectively passes the first shaped beam through the plurality of apertures to form a second shaped beam;
    a shaping deflector which is disposed between the first shaping aperture and the second shaping aperture and which varies a projected position of the first shaped beam over the second shaping aperture;
    an objective deflector which deflects the second shaped beam;
    a stage on which a substrate to be processed is mounted to be irradiated with the second shaped beam;
    a blanking deflector disposed between the charged beam source and the first shaping aperture;
    a blanking aperture disposed between the second shaping aperture and the objective deflector and which intercepts the second shaped beam based on driving of the blanking deflector;
    a memory which stores reference shapes or reference positions of the plurality of apertures as first data;
    a first detector which, when the first shaped beam is scanned over the second shaping aperture in a state in which the blanking deflector is driven to prevent the second beam from irradiating the substrate to be processed, measures shapes or positions of the plurality of apertures in the second shaping aperture irradiated on a surface of the blanking aperture to acquire second data;

a control calculator which compares the second data with the first data to calculate a shift amount; and a first deflection control circuit which corrects a deflection amount of the objective deflector in accordance with the shift amount.

10. The charged beam writing tool according to claim 9, further comprising a second deflection control circuit which corrects the deflection amount of the shaping deflector in accordance with the shift amount.

11. The charged beam writing tool according to claim 9, wherein the first detector detects reflected electrons from the blanking aperture.

12. The charged beam writing tool according to claim 9, wherein the first detector detects reflected electrons from the second shaping aperture.

13. A charged beam writing tool according to claim 9, wherein the first detector detects an inflow current to the blanking aperture.

14. The charged beam writing tool according to claim 9, wherein the first detector detects an inflow current to the second shaping aperture.

15. The charged beam writing tool according to claim 9, wherein the memory stores a deflection amount of the shaping deflector and that of the objective deflector at a start of an operation as reference deflection amounts.

16. The charged beam writing tool according to claim 9, wherein the memory stores initial shapes or initial positions of the plurality of apertures of the second shaping aperture at a start of an operation as the first data.

17. The charged beam writing tool according to claim 9, wherein the stage comprises a mark for measuring a shape of the second shaped beam.

18. The charged beam writing tool according to claim 17, further comprising a second detector which detects reflected electrons from the mark.

19. The charged beam writing tool according to claim 9, further comprising a third detector which detects a position of the second shaping aperture.

20. The charged beam writing tool according to claim 19, further comprising a second stage which holds the second shaping aperture, wherein the third detector detects a position of the second stage.

21. The charged beam writing tool according to claim 19, wherein the second shaping aperture comprises a mark for measuring the position, and the third detector optically detects the mark for detecting the position.

* * * * *